United States Patent [19]

Uematsu et al.

[11] Patent Number: 4,733,225
[45] Date of Patent: Mar. 22, 1988

[54] COOLING MEDIUM TEMPERATURE MONITORING SYSTEM FOR ROTARY ELECTRIC MACHINE

[75] Inventors: Yutaka Uematsu; Morio Matsusaki, both of Kobe, Japan

[73] Assignee: Mitsubishi Denki Kabushiki Kaisha, Tokyo, Japan

[21] Appl. No.: 784,302

[22] Filed: Oct. 4, 1985

[30] Foreign Application Priority Data

Oct. 4, 1984 [JP] Japan .................................. 59-207007
Oct. 4, 1984 [JP] Japan .................................. 59-207009

[51] Int. Cl.⁴ .............................................. G08B 17/00
[52] U.S. Cl. .................................... 340/584; 340/679
[58] Field of Search ................. 340/679, 584, 588, 57; 374/145

[56] References Cited

U.S. PATENT DOCUMENTS 3,601,689 8/1971 Kettler .
4,113,211 9/1978 Glazar ................................ 340/57 X
4,316,175 2/1982 Körber et al. ......................... 340/57
4,330,808 5/1982 Sawada et al. .
4,364,032 12/1982 Narato et al. ........................ 340/679
4,470,092 9/1984 Lombardi .

FOREIGN PATENT DOCUMENTS 1199394 8/1965 Fed. Rep. of Germany .
2635044 2/1978 Fed. Rep. of Germany .
3035083 3/1981 Fed. Rep. of Germany .
3233203 3/1983 Fed. Rep. of Germany .

OTHER PUBLICATIONS

ASME Publication 81-JPGC-Pwr-23; Generator Monitoring System by F. T. Emery, 1981.

Primary Examiner—Glen R. Swann, III
Assistant Examiner—Thomas J. Mullen, Jr.
Attorney, Agent, or Firm—Wenderoth, Lind & Ponack

[57] ABSTRACT

A cooling medium temperature monitoring system for a rotary electric machine for cooling stator coils by as cooling medium flowing in a plurality of cooling medium passages provided in the stator coils, has a plurality of temperature detectors for measuring the temperatures of the cooling medium in the outlets of the plurality of cooling medium passages; and a circuit for setting the temperature warning value at a value which is responsive to the output of a generator, and a calculator circuit for comparing the detected outputs of the temperature detectors with the set value of the warning value setting circuit to generate an alarm signal when the output of any one of the detectors exceed the set warning value.

5 Claims, 12 Drawing Figures

COOLING MEDIUM TEMPERATURE MONITORING SYSTEM FOR ROTARY ELECTRIC MACHINE

BACKGROUND OF THE INVENTION

The present invention relates to a cooling medium temperature monitoring system for monitoring the temperature of cooling medium in the outlet of a cooling medium passage provided in a stator coil of a rotary electric machine.

According to conventional system of this type, there is a cooling medium temperature monitor of a turbine generator as shown in FIGS. 1, 2 and 3. FIG. 1 is an explanatory view showing the air flowing within a turbine generator; FIG. 2 is a sectional view showing a stator coil, and FIG. 3 is an explanatory view of a monitoring circuit of the temperature of cooling medium in the outlet of the cooling medium passage of the stator coil.

In FIG. 1, reference numeral 1 designates a frame of a generator, which is constructed as an airtight structure to seal hydrogen gas therein. Numeral 2 designates a stator core; numeral 3 designates a stator coil; numeral 4 designates a rotor; numeral 5 designates bearings for supporting both ends of a rotational shaft 4a of the rotor 4; numeral 6 designates a blower projected from the outer periphery of one end of the rotor 4; and numeral 7 designates a hydrogen gas cooler. Reference character $G_1$ designates an arrow showing the direction of the low temperature hydrogen gas flow; character $G_2$ designates an arrow showing the direction of the hydrogen gas flow in the stator coil 3; character $G_3$ designates an arrow showing the direction of the hydrogen gas flow in the outlet of a cooling medium passage provided in the stator coil 3; and character $G_4$ designates an arrow showing the direction of the hydrogen gas flow in the rotor coil.

The cooling operation of the hydrogen gas is described as follows. The hydrogen gas is sealed in the frame 1, and fed to the gas cooler 7 by the blower 7 provided on the rotor 4 and is cooled. The cooled low temperature hydrogen gas 8 flows in the direction of the arrow $G_1$. The hydrogen gas 8 then flows from the gas inlet of the stator coil 3 axially through the stator coil 3 (in the direction of the arrow $G_2$). The hydrogen gas removes the generated heat such as resistance losses of the stator coil 3 at this time, and is exhausted from the outlet of the cooling medium passage of the stator coil 3 in the direction of the arrow $G_3$.

On the other hand, the low temperature hydrogen gas fed to the rotor coil of the rotor 4 flows from both ends of the rotor coil toward the center in the axial direction (of the arrow $G_4$). Then, the hydrogen gas removes the heat generated in the rotor coil and is exhausted from the center of the rotor coil.

The exhausted hydrogen gas which is at a high temperature is fed by the blower 6 to the gas cooler 7. Then, the heat from the hydrogen gas is thermally exhanged to the cooling water so that the gas again becomes a low temperature gas, and is again circulated in the directions of the arrows $G_1$, $G_2$, $G_3$ and $G_4$.

The structure of the vicinity of the stator coil 3 is formed as shown in FIG. 2. In FIG. 2, reference numeral 12 designates a stator core; numeral 13 designates a stator slot, and the stator coil 3 is inserted into the slot 13. Numeral 14 designates a ground insulating member of the stator coil 3; numeral 15 designates a stator coil conductor; and numeral 16 designates a wind conduit buried in the conductor 15. The conduit 16 is provided over the entire length of the stator coil, the hydrogen gas is passed through the conduit 15 to thereby cool the stator coil 3. The stator coil 3 is interposed between spacers 18 and 19 and held so as not to be exhausted into the stator slot 13 by a slot wedge 20.

The monitoring circuit of the temperature of the cooling medium is shown in FIG. 3. The hydrogen gas removes the heat of the stator coil 3 when passing the stator coil 3, and is exhausted from the outlet of the cooling medium passage and hence the outlet of the conduit 16 (FIG. 2). Numeral 21 designates a plurality of temperature measuring elements provided in the outlet of the cooling medium passage of the stator coil 3 for measuring the temmperature of the hydrogen gas exhausted from the outlet. A temperature signal from the element 21 is inputted to a recording meter 22 and a warning unit 23.

The warning unit 23 always simultaneously monitors the temperature signals from all the temperature measuring elements 21, and generates an alarm when the temperature detected by any of the temperature measuring elements 21 exceeds a preset warning value. The warning value is determined to be a predetermined value depending only upon the temperature measuring data irrespective of the magnitude of the load of the generator and hence the amplitude of the armature current.

FIG. 4 shows a graph showing the relationship between the armature current, the temperature of the cooling medium in the outlet of the cooling medium passage and the warning value, where the rise of the temperature of the cooling medium with respect to the rated armature current is represented by 1 (p.u.).

Since the conventional cooling medium temperature monitor is constructed as described above, it is difficult to discover malfunctions of the stator coil until one of the temperature signals detected by the plurality of temperature measuring elements of the stator coil 3 exceeds the warning value to generate an alarm. Thus, the conventional cooling medium temperature monitor has a problem in that it takes a relatively long time after the malfunction occurs before the malfunction can be detected (i.e.—the time required for the stator to heat up).

Moreover, as can be seen from FIGS. 3 and 4, the temperature of the cooling medium (i.e.—hydrogen gas) in the outlet of the cooling medium passage, indicated by arrow $G_3$, of the stator coil is directly proportional to the amplitude of the armature current. However, in the prior art monitoring system, the warning value is constant irrespective of the armature current. Therefore, the conventional monitor has a further problem in that a difference in warning values are inherent in prior art systems. Namely, since the prior art system generates an alarm only as a function of the output of the temperature measuring elements 21 (i.e.—irrespective of the magnitude of the armature current of the generator), which represents a preset warning value, the temperatures corresponding to small armature currents are lower than the temperatures corresponding to large armature currents so that malfunctions of the stator coil are difficult to correctly determine for low armature currents, while, on the other hand, alarms tend to be erroneously generated due to the rise of the temperature of the cooling medium in the area that the armature current is large.

In addition, in order to discover a malfunction of the stator coil 3 before generating an alarm, the variation in the armature current and the timing change of all of the temperature values indicated on the temperature recording meter are heretofore compared and judged by an operator. Therfore, operator's fatigue due to the constant monitoring becomes high, and the determination of whether or not the stator coil 3 is malfunctioning is performed based on the operator's experience, thereby resulting in an erroneous determination.

SUMMARY OF THE INVENTION

The present invention is made to eliminate the problems of the conventional device, and has for its object to provide a cooling medium temperature monitoring system for a rotary electric machine which can quickly discover the malfunction of a generator, and which prevents in advance a defect and alleviates an operator's load.

According to the present invention, there is provided a cooling medium temperature monitoring system for a rotary electric machine for measuring the temperature of a cooling medium in the outlet of a cooling medium passage of a plurality of stator coils of a stator coil assembly, determining the temperature difference between two or more measured temperatures, and generating an alarm when one of the obtained temperature differences exceeds a predetermined warning value in relation to the output of a generator.

According to an aspect of the present invention, upper and lower temperature warning values, representative of upper and lower limits are set in relation to the output levels of a generator for each value of cooling medium temperature in the outlet of a cooling medium passage of a stator coil; the temperature of the cooling medium measured at the outlet of the cooling medium passage and the measured armature current are compared with the respective set of these temperature warning values, and an alarm is generated when the measured temperatures of the cooling medium falls outside the upper or lower range of these temperature warning values of the respective set.

DESCRIPTION OF THE PREFERRED EMBODIMENTS

An embodiment of the invention will be described below in conjunction with the accompanying drawings.

Figure 1:
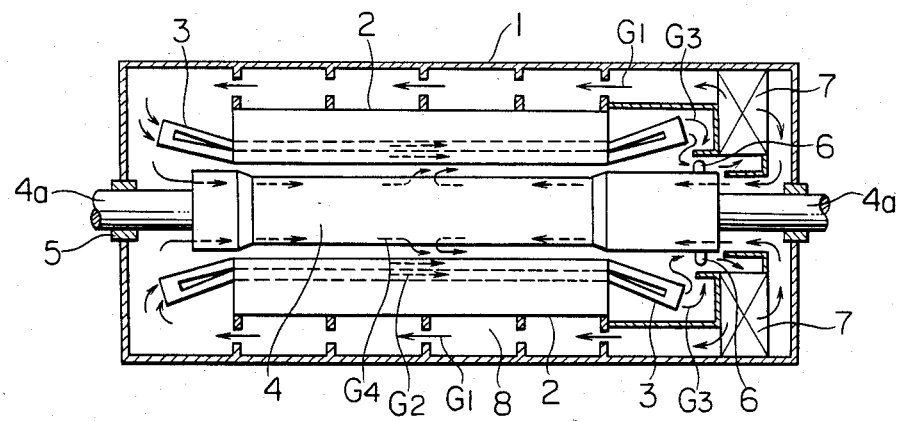
FIG. 1 is an explanatory view showing the construction of a conventional turbine generator and a cooling gas flowing system based on the present invention.
Figure 2:
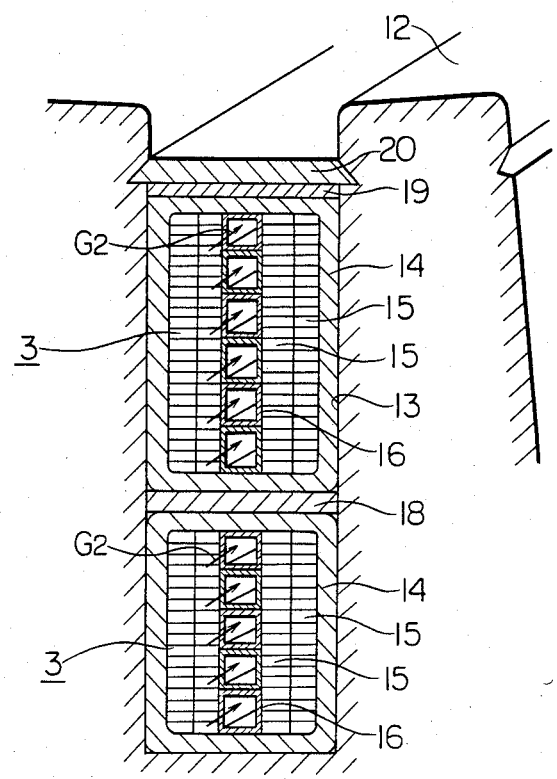
FIG. 2 is a sectional view of the vicinity of a stator coil of the conventional generator.
Figure 3:
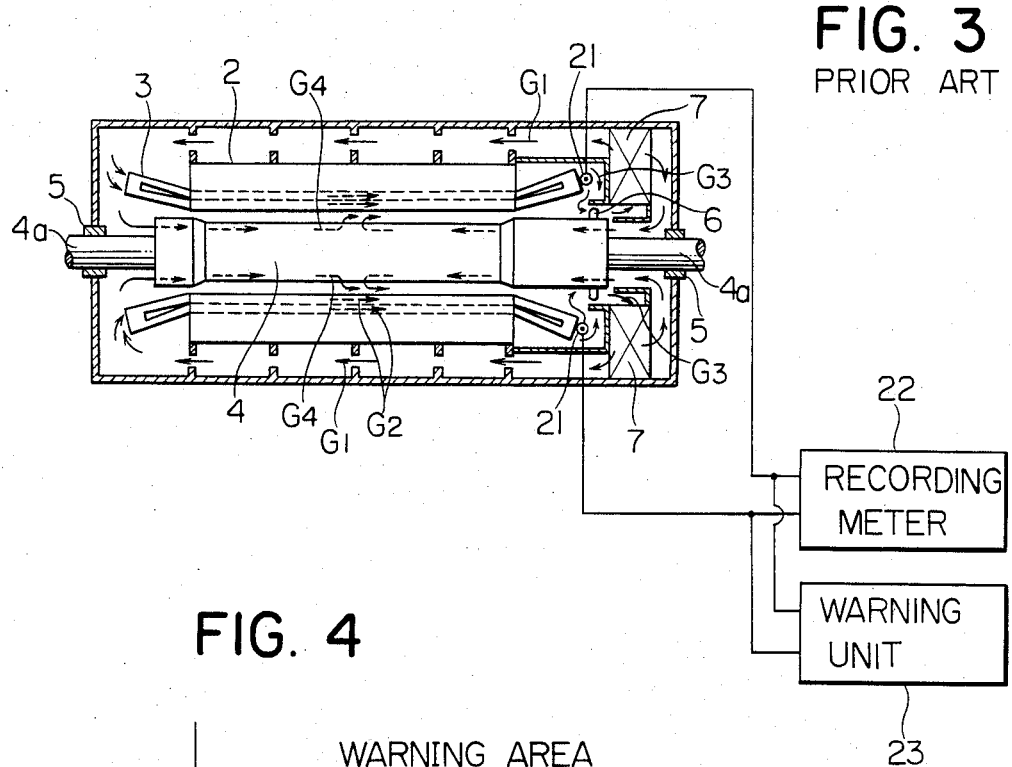
FIG. 3 is an explanatory view of a conventional cooling medium temperature monitoring circuit.
Figure 4:
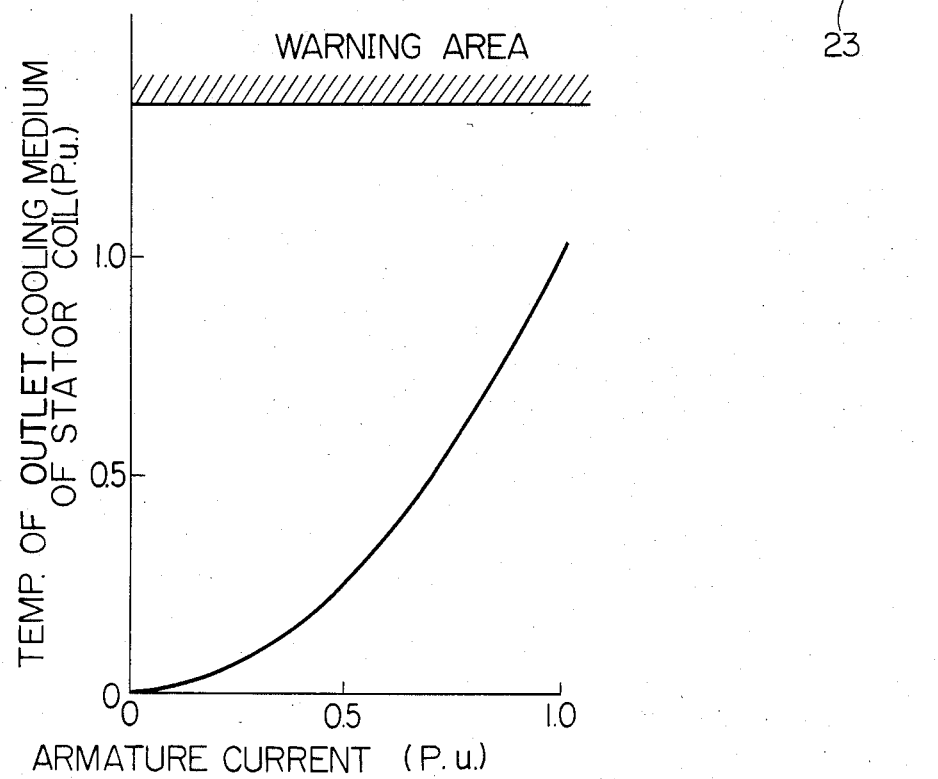
FIG. 4 is a graph showing the relationship between the armature current and the set warning value of the conventional system.
Figure 5:
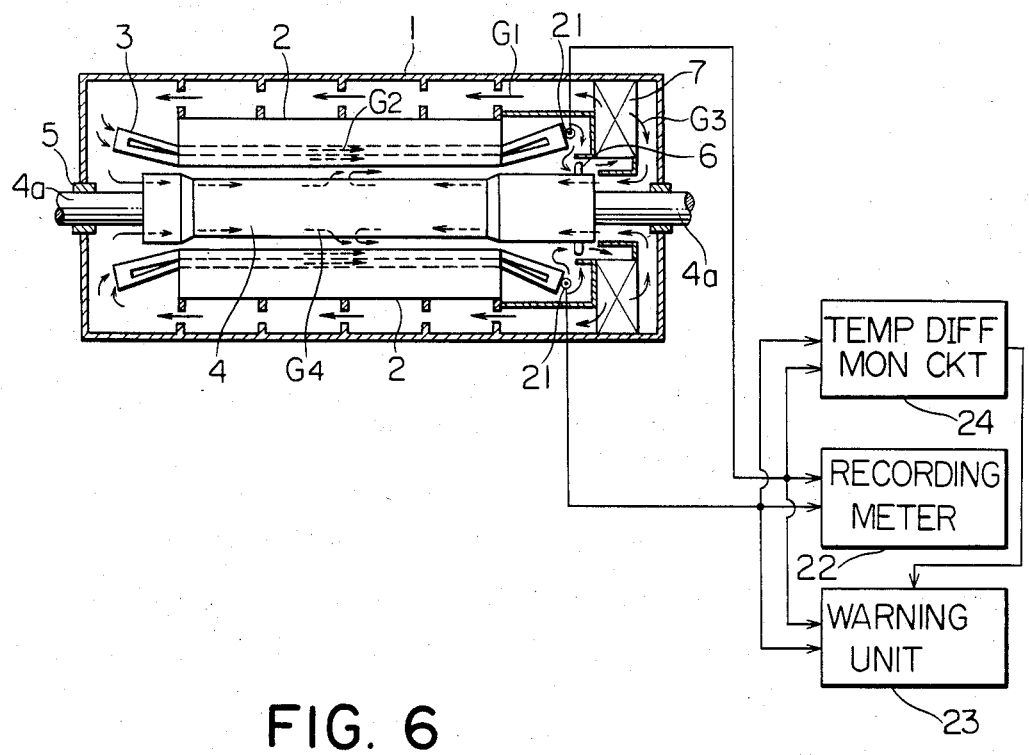
FIG. 5 is a view of the construction of a cooling medium temperature monitoring system of a rotary electric machine according to an embodiment of the present invention.

In FIG. 5, reference numeral 21 designates a plurality of temperature measuring elements provided in the outlet of a cooling medium passage provided in stator coils 3; numeral 22 designates a temperature measuring recording meter connected to a number of temperature measuring elements 21; and numeral 23 designates a warning unit connected similarly to display a warning by a sound or a light. A temperature difference monitoring circuit 24 for calculating the difference between two measured temperatures is connected to the temperature measuring elements 21, and the warning unit 24 is controlled on the basis of the output of the temperature difference monitoring circuit 24.

Figure 6:
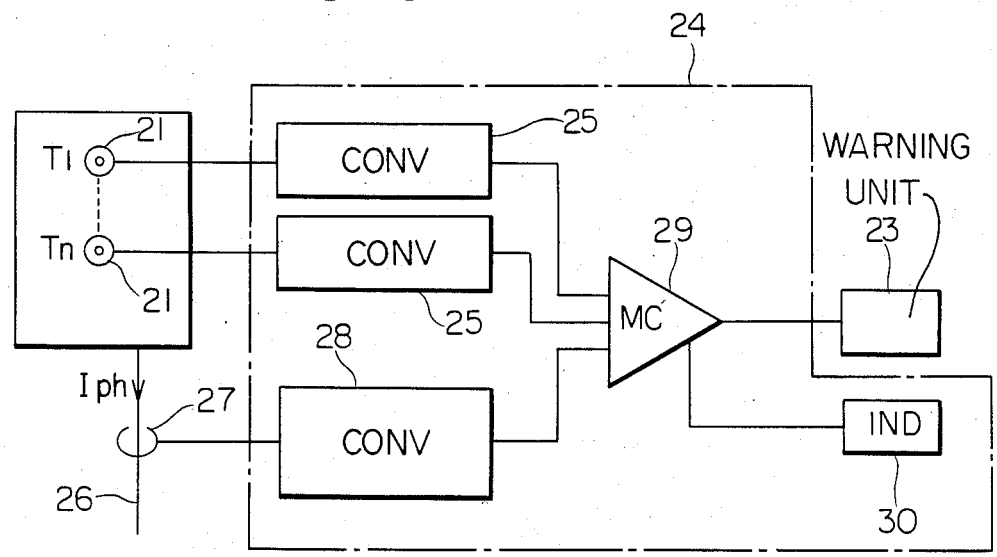
FIG. 6 is a circuit diagram of the temperature difference monitoring circuit of the cooling medium.

FIG. 6 shows a concrete example of the temperature difference monitoring circuit 24. In this monitoring circuit 24, the measured temperature signals of the temperature measuring elements 21 are inputted through a cables to converters 25 provided at the respective stator coils 3 as variations in the resistance values of temperature measuring resistors or in the voltages generated from thermocouples. The converters 25 output, for example, input signals, which are stable analog signals which have been integrated with respect to time, to a microcomputer 29. On the other hand, the armature current of the generator is detected by a current transformer 27 provided in a circuit of a bus 26 for feeding the generated power to a main transformer (not shown); the detected current is inputted to a converter 28, and the converter 28 inputs the current as the signal corresponding to the amplitude of the armature current to a microcomputer 29. Numeral 30 designates an indicating instrument which always indicates the temperature difference and the amplitude of the armature current as the outputs of the microcomputer 29 for the operator, and which operates the warning unit 23 when the temperature difference exceeds the above-described warning value.

Figure 7:
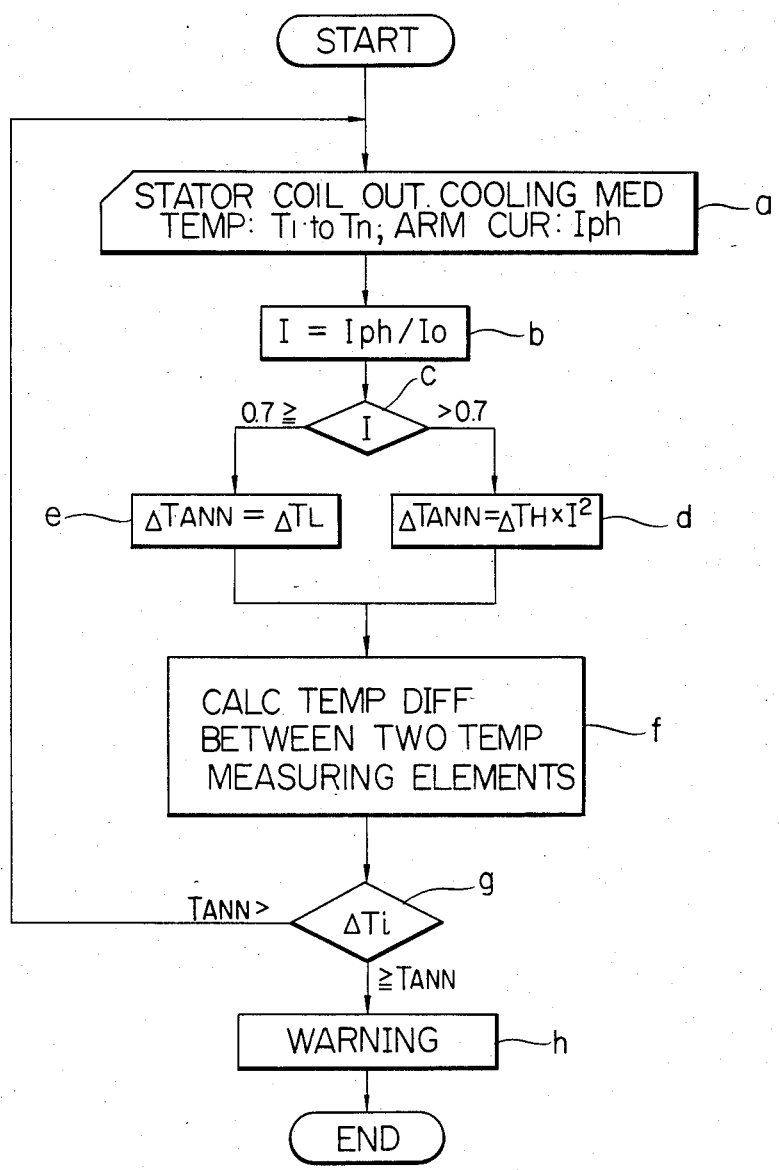
FIG. 7 is a flowchart showing the flow of the circuit operation of FIG. 6.

The operation of the cooling medium temperature monitoring system constructed as described above will now be described with reference to the flowchart of FIG. 7.

(a) The cooling medium temperatures $T_1$ to $T_n$ in the outlet of the respective cooling medium passages are first detected by the plurality of temperature measuring elements 21 provided in the respective stator coils 3, the armature current Iph is detected from the current transformer 27, and the detection signals are read through the converters 25 and 28 by the RAM of the microcomputer 29.

(b) The processor calculates from the armature currents read out in the RAM and the rated armature current stored in advance in a ROM the current value I converted into p.u.

(c) Then, the processor determines whether or not the current value I is, for example, larger than 0.7 of the value for largely affecting the temperatures measured by the temperature measuring elements 21.

(d) If I>0.7, the temperature $\Delta T_{ANN}$ is set to $\Delta T_H \times I^2$ as the warning value.

(e) If I≦0.7, the temperature $\Delta T_{ANN}$ is set to $\Delta T_L$ as the warning value.

(f) Then, the temperature difference $\Delta T_i$ is obtained for two or more temperature measuring elements. This difference $\Delta T_i$ is obtained by the temperature difference between two of the plurality of temperature measuring elements 21 provided for the plural stator coils 3.

(g) Whether or not the plurality of temperature differences $\Delta T_i$ obtained in this manner are larger than the warning value $\Delta T_{ANN}$ is determined. In other words, $\Delta T_i \geqq \Delta T_{ANN}$ is determined.

(h) If $\Delta T_i \geqq \Delta T_{ANN}$, the microcomputer 29 outputs a signal to the warning unit 23 and warns the operator for that the stator coil is malfunctioning.

In the operation of the temperature difference monitoring, even if the stator coil 3 is normal, the temperature of the cooling medium in the outlet of the cooling medium passage has an irregularity of approximately 4° to 5° C. at the time of the rated current flow through the generator, i.e.—a temperature difference inherently exists in the different armature coils. Therefore, in order to reduce the influence of this irregularity and to raise the monitoring accuracy, the temperature differences obtained between two of the temperature measuring elements are monitored with two temperature measuring elements, and these elements are disposed at the position where the cooling medium temperature difference is minimal. If there are more than two elements, then these temperature mesuring elements are mounted at respective positions displaying minimal temperature differences on the basis of the result of a trial and error operation of the generator. In this way, an alarm can be generated when the temperature difference exceeds the set warning value.

When thus operated, the temperature difference between the output of one normal temperature measuring element 21 used as a reference and the output of another temperature measuring element 21 can be compared to determine a malfunction in relation to the armature current to provide a warning.

Figure 8:
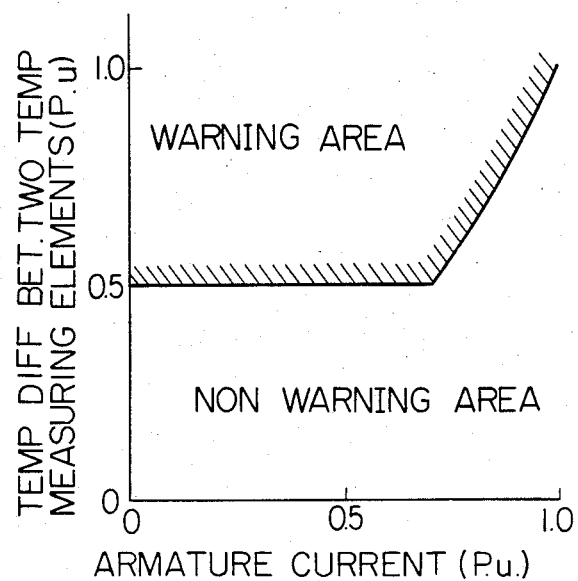
FIG. 8 is a graph showing the relationship between the armature current and the set warning value.

As described above, the cooling medium temperatures of the stator coils 3 vary according to the output and hence the armature current of the generator, and the temperature difference between the two temperature measuring elements increases when the armature current increases. Thus, the warning value is set in response to the armature current as shown in FIG. 8. The warning values in response to the armature current are stored in advance in the ROM of the microcomputer 29. Here, the allowable value of the temperature difference between the two temperature measuring elements 21 is defined as 1 (p.u.), and this value can be adjustable for the individual generators. Since the temperature difference of the warning area at the low load time of the generator decreases, an erroneous warning might be generated. To this end, the minimum value $\Delta T_1$ of the temperature difference between the two temperature measuring elements 21 is limited in advance.

In the embodiment described above, the turbine generator in which the stator coil 3 was cooled by the hydrogen gas has been described. However, the present invention is not limited to the particular embodiment. For example, the stator coil 3 can be applied to the turbine generator cooled by water or oil.

According to the present invention as described above, the temperatures of the cooling medium in the outlets of the cooling medium passage in a plurality of stator coils are measured by the specific temperature measuring elements; the temperature differences of two or more measured values are obtained, and when any of the temperature differences exceed the preset warning value set in advance in response to the magnitude of the armature current, a malfunction of the stator coil is determined so as to generate an alarm. Therefore, a thermal or insulating defect can be prevented in advance due to the insufficient cooling of the generator and particularly the stator coil, and the reliability of the generator can be improved. Furthermore, the operator's fatigue load can be alleviated by the automatic monitoring.

FIGS. 9 to 12 show another embodiment of the present invention. The temperature warning values of upper and lower limits responsive to the output of the generator are set in advance for the outlets of the cooling medium passages in a stator coil; the temperatures of the cooling medium measured in the outlets of the cooling medium passage are compared with the temperature warning value, and when the temperature of the cooling medium falls within the temperature warning values of the upper and lower limits, an alarm is generated. In the embodiment described above, the coil can be protected not only when a malfunction occurs in the generator so that the temperature of the coil and hence the cooling medium temperature abnormally rises but also when a malfunction occurs in a temperature measuring element such as a search coil or a thermocouple.

Figure 9:
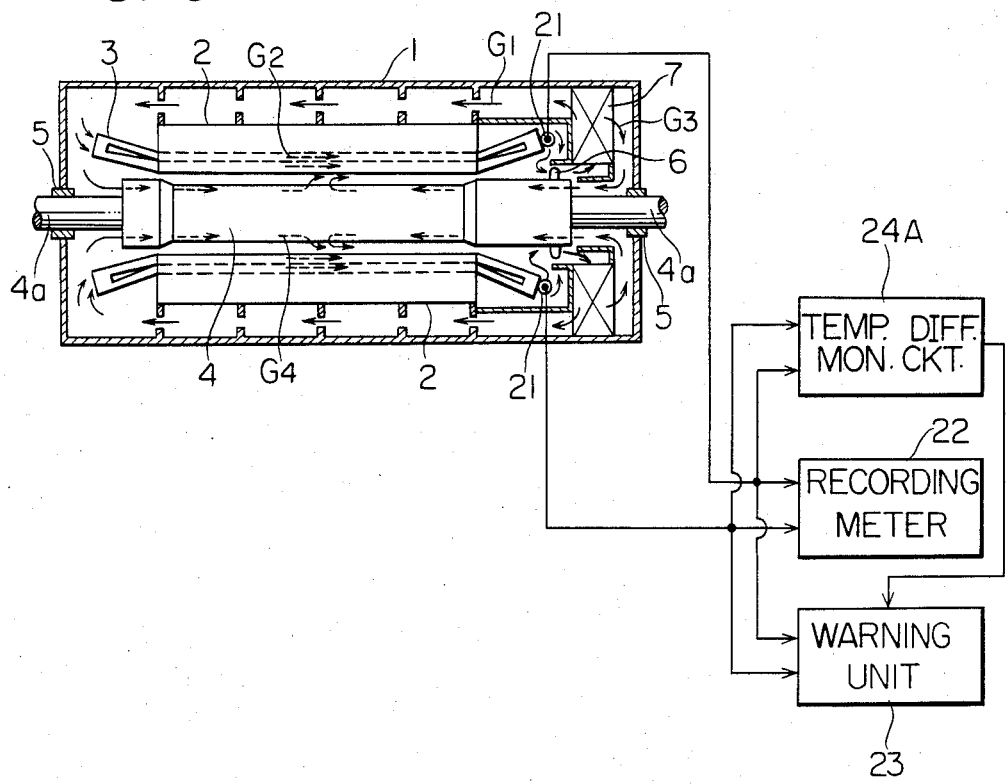
FIG. 9 is a view of the construction of a cooling medium temperature monitoring system for a rotary electric machine according to another embodiment of the present invention.

In FIG. 9, reference numeral 21 designates temperature measuring elements provided in the outlets of a cooling medium passage provided in stator coils 3; numeral 22 designates a recording meter connected to the temperature measuring elements 21 to indicate by a sound or a light. Numeral 24A designates temperature monitoring units, which compare the temperature warning values of the preset upper and lower limits responsive to the output of the generator for the temperatures of the cooling medium in the outlets of the cooling medium passage with the temperature difference from the temperatures measured by the temperature measuring elements, and the warning unit 23 outputs an alarm signal when the temperature difference indicates a malfunction.

Figure 10:
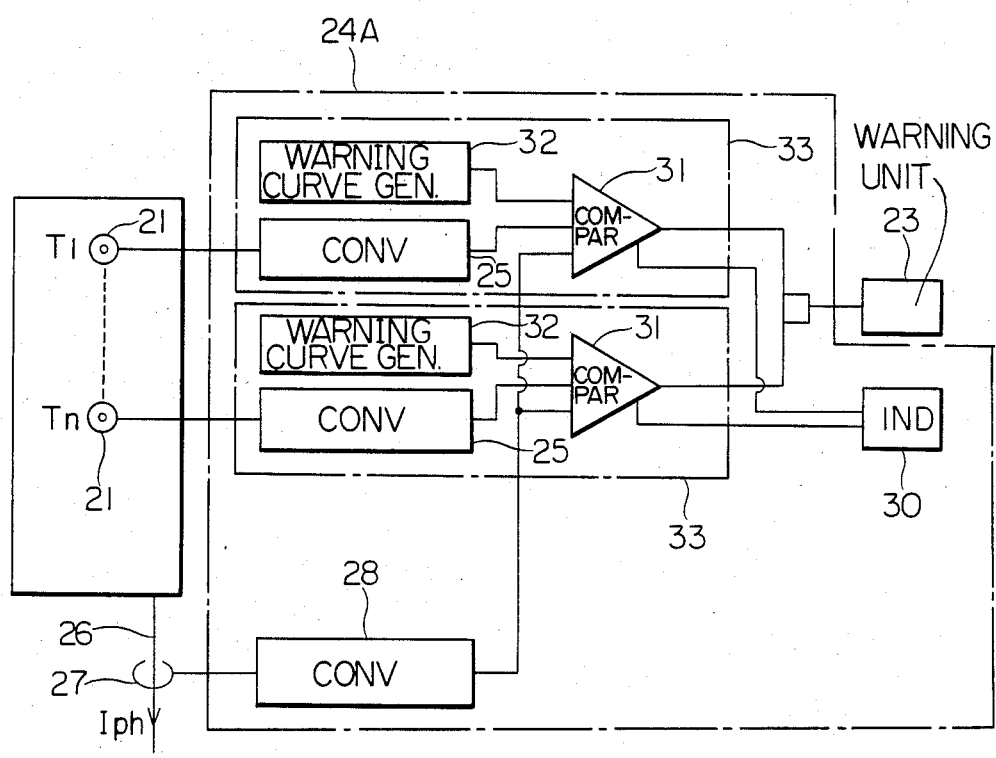
FIG. 10 is a circuit diagram showing the temperature monitoring system of the cooling medium shown in FIG. 9.

FIG. 10 concretely shows the temperature monitoring unit 24A. In the circuit of the monitoring unit 24A, the temperature measuring signals of the temperature measuring elements 21 are respectively inputted to the converters 25 provided for the stator coils 3 through cables as the variations in the resistance value or the temperature measuring resistors or the voltage generated from thermocouples. The converters 25, for example, output stable analog signals which have been integrated with respect to time to comparators 31. On the other hand, the armature current of the generator is detected by a current detector 27, and the detected current is inputted through a converter 28 to the comparators 31. Reference numeral 32 designates a warning curve generator which generates the temperature warning values of the upper and lower limits of the cooling medium temperature in the form of the secondary curve in response to the amplitude of the output and hence the armature current of the generator. Therefore, the comparator 31 compares the measured temperature responsive to the armature current with the temperature warning value and the warning unit 23 outputs an warning signal when the difference increases abnormally.

Figure 11:
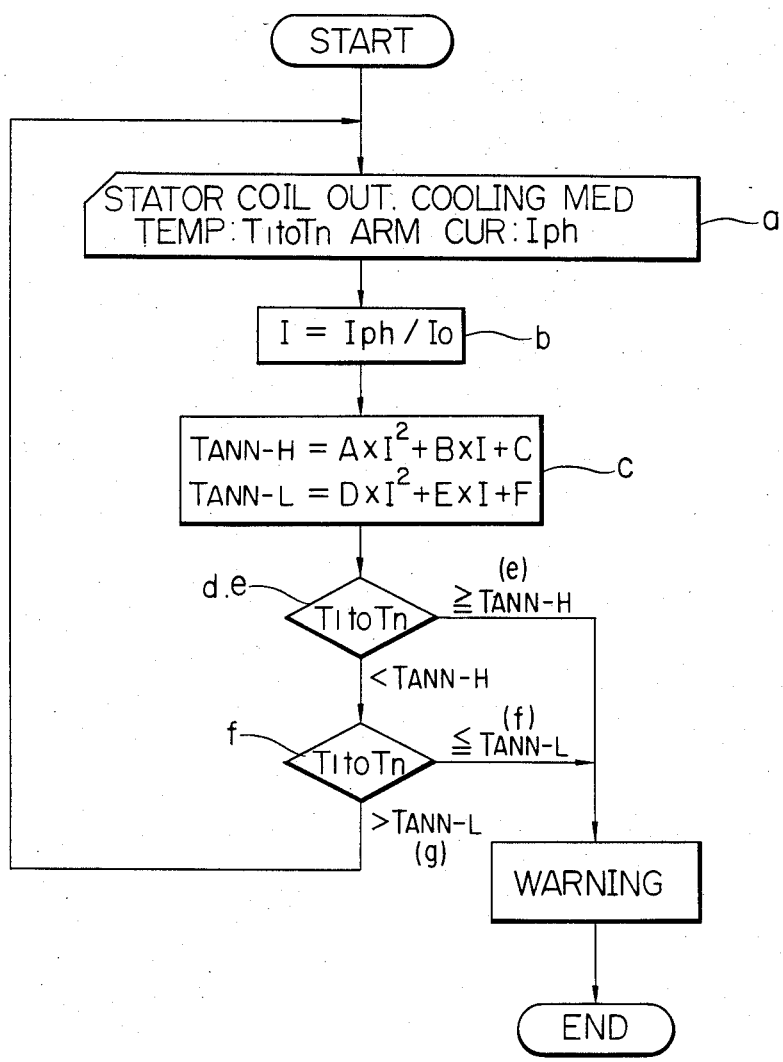
FIG. 11 is a flowchart showing the flow of the circuit operation of FIG. 10.

The operation of the cooling medium temperature monitoring system constructed as described above now be described with reference to the flowchart of FIG. 11.

(a) The cooling medium temperatures $T_1$ to $T_n$ are first detected by the plurality of temperature measuring elements 21 provided in the respective stator coils 3, the armature currents Iph are detected from the current transformer 27, and the detection signals are read through the converters 25 and 28 by the comparators 31.

(b) The current value I converted at p.u. is obtained from the armature current Iph read out in the comparator 31 and the preset rated armature current.

Figure 12:
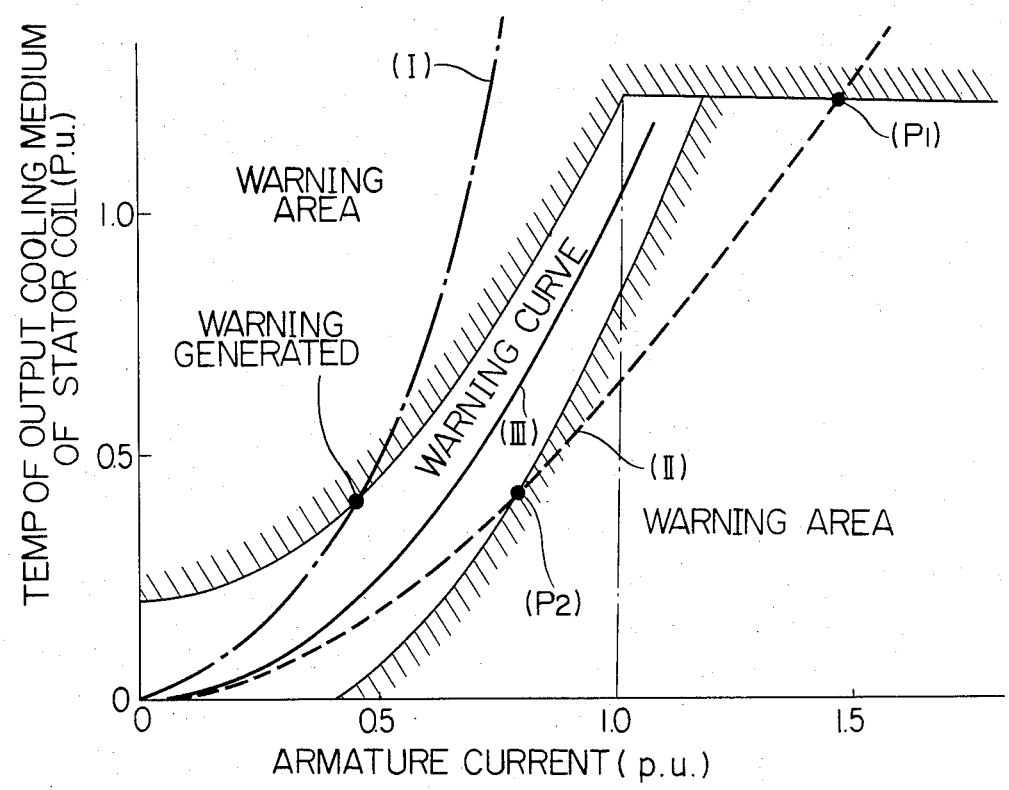
FIG. 12 is a graph showing the relationship between the armature current and the set warning value.

(c) Then, the temperature warning values of the upper and lower limits responsive to the armature current are set in the form of a secondary curve and stored. The temperature warning value is proportional to approximately the square of the armature current I in the increasing temperature value of the cooling medium. Thus, the upper limit is set to $T_{ANN-H} = AxI^2 + Bx I + C$, and the lower limit is set to $T_{ANN-L} = DxI^2 + Ex I + F$ as shown in FIG. 12 with suitable margins, and the trends of the two secondary curves are suitably selected by arbitrarily selecting the coefficients A, B, C and D, E, F. Furthermore, even if the stator coil 2 is normal, the temperatures of the cooling medium have an irregularity of approximately 4° to 5° C. even at the rated armature current. Thus, it is necessary to store warning curves responsive to the respective temperature measuring elements.

(d) Here, whether or not the measured temperatures $T_1$ to $T_n$ are larger than the temperature set value $T_{ANN-H}$ of the upper limit is first determined.

(e) If any one of $T_1$ to $T_n$ is larger than or equal to the $T_{ANN-H}$ ($T_1$ to $T_n \geq T_{ANN-H}$), the comparator 31 outputs an alarm signal to the warning unit 23.

The cooling medium temperature curve (I) shown by a dotted chain line in FIG. 12 illustrates one example of this state to show that the temperature of the coil is abnormally high.

(f) If $T_1$ to $T_n \leq T_{ANN-L}$ is not true when $T_1$ to $T_n \leq T_{ANN-H}$ is determined, the comparator 31 outputs an alarm signal to the warning unit 23.

The cooling medium temperature curve (II) shown by a broken line in FIG. 13 illustrates one example of this state. This shows the warning state of the case that a temperature measuring element has malfunctioned. In other words, if a temperature measuring element has malfunctioned the cooling medium temperature curve is shifted from the normal value as shown by the broken line (III), it would not have been possible to output an alarm signal until the cooling medium temperature arrived at the warning area of the upper limit (the point $P_1$) if the warning area of the lower limit was not present, whereby excessive current flows through the coil. However, in this embodiment the alarm signal can be outputted early at the point ($P_2$) when the cooling medium temperature arrives at the warning area of the lower limit, thereby preventing an excessive current from flowing to the coil.

(g) However, in case of $T_{ANN-L} < T_1$ to $T_n < T_{ANN-H}$, the cooling medium temperature is normal as shown by the cooling medium temperature curve (III) in FIG. 12, and the stationary coil is normally operated so as to generate no alarm.

As described above, the temperature signal, the armature current signal and the temperature warning value signal are always inputted to the comparator 31, and the temperature signal responsive to the armature current is always compared with the warning curve. The magnitudes of the temperature signal and the armature current are always indicated by the instrument 30 for the operator. The converter 25, the warning curve generator 32 and the comparator 31 are integrated to reduce the size of the system for the convenience of mass production, and the occurrence of malfunctions can be minimized.

In the all of the embodiments described above, a determination is made as to whether or not the temperatures of the cooling medium in the outlets of the cooling medium passage in a plurality of stator coils are within the temperature warning value areas of the upper and lower limits preset in response to the output of the generator, and when falling within the temperature warning value range, the alarm is generated, and if a temperature measuring element malfunctions, the occurrence of the thermal or insulating defect due to the insufficient cooling of the generator and particularly the stator coil can be rapidly recognized, thereby resulting in the necessary maintenance and inspection. Furthermore, the operator's fatigue load can be alleviated by the automatic monitoring.

What is claimed is:

1. A cooling medium temperature monitoring system for a rotary electric machine for cooling stator coils by means of a cooling medium flowing in a plurality of cooling medium passages provided in the stator coils, comprising:
   a plurality of temperature detecting means for measuring the temperatures of the cooling medium in the outlets of the plurality of cooling medium passages and for providing outputs corresponding thereto;
   a means for setting temperature warning values as a function of the output of a generator, and
   a means for respectively comparing said outputs of said plurality temperature detecting means with said set warning values of said warning value setting means and for generating an alarm signal when said output of any of said plurality of detecting means exceeds a corresponding set warning value.

2. A cooling medium temperature monitoring system according to claim 1, wherein said means for comparing obtains the respective temperature differences between each of the detected temperatures of the cooling medium temperatures measured by said temperature detecting means and generates an alarm signal when any of the temperature differences exceeds its corresponding set warning value.

3. A cooling medium temperature monitoring system according to claim 2, wherein said plurality of temperature detecting means comprise two temperature detecting means which are disposed at respective positions having a minimal cooling medium temperature difference during normal operation of the rotary electric machine.

4. A cooling medium temperature monitoring system according to claim 1, wherein said means for setting temperature warning values comprises a warning curve generating means for setting temperature warning values representative of upper and lower limits of the cooling medium temperatures as a function of said output of said generator, and wherein said means for comparing generates an alarm signal when the temperature of the cooling medium measured by any of said plurality of temperature detecting means exceeds said temperature warning values representative of said upper or lower limit.

5. A cooling medium temperature monitoring system according to claim 4, wherein said warning curve generating means sets said temperature warning values as a function of the squared value of the armature current of the generator.

* * * * *